Nov. 17, 1970 W. P. KRAM 3,541,357
INTEGRATED CIRCUIT FOR ALTERNATING CURRENT OPERATION
Filed April 29, 1968 2 Sheets-Sheet 1

INVENTOR:
WILLIAM P. KRAM,
BY Robert J. Mooney
HIS ATTORNEY.

Nov. 17, 1970 W. P. KRAM 3,541,357

INTEGRATED CIRCUIT FOR ALTERNATING CURRENT OPERATION

Filed April 29, 1968 2 Sheets-Sheet 2

INVENTOR:
WILLIAM P. KRAM,
BY Robert J. Mooney
HIS ATTORNEY.

United States Patent Office 3,541,357

Patented Nov. 17, 1970

3,541,357

INTEGRATED CIRCUIT FOR ALTERNATING CURRENT OPERATION

William P. Kram, Fayetteville, N.Y., assignor to General Electric Company, a corporation of New York Filed Apr. 29, 1968, Ser. No. 724,870
Int. Cl. H03k 3/00
U.S. Cl. 307—303 5 Claims

ABSTRACT OF THE DISCLOSURE

A semiconductor monolithic integrated circuit is provided having reverse biased PN junction substrate isolation, and the circuit is made capable of working directly from an alternating current power supply without disruption of the substrate isolation by provision of an integral switching circuit. The switching circuit is effective to prevent sufficient voltage from developing across the substrate isolation PN junction to cause deleterious forward current across the junction during that portion of the cycle of the alternating current power supply when the substrate isolation PN junction tends to become forward biased.

The present invention relates to improvements in semiconductor integrated circuits of the type having a plurality of circuit elements situated in a common body of semiconductor material and which are sometimes referred to as "monolithic" integrated circuits. More particularly, the present invention relates to improvements in such circuits facilitating operation thereof directly from a supply of alternating current voltage.

In such monolithic integrated circuits, it is a known practice to achieve desired electrical isolation of the various circuit elements, each from its neighbors, by forming them in particular regions or islands in the semiconductor body, each of which islands is electrically separated or isolated from the remaining substrate portion of the semiconductor body by a reverse-biased PN junction. The reverse-bias of this isolating PN junction, or isolation diode as it is sometimes called, is achieved by tying or connecting the substrate to a point of desired potential, or bias-point, in the circuit. The bias-point usually selected is that point which normally has the most extreme potential of opposite polarity from the conductivity type of the substrate, e.g., if the substrate is of P-type conductivity, the bias-point to which it is usually tied is the point having the most negative potential in the circuit. This insures reverse biasing of the isolation diode.

This reverse-biased-junction form of isolation has been found satisfactory in those types of integrated circuits, such as circuits having a direct current or unvarying polarity power supply, wherein the potential of a single selected bias-point never ceases to fulfill the requirement of being the most extreme potential of opposite polarity to the conductivity type of the substrate. However, in some integrated circuits, for example those intended for direct connection to a supply voltage of alternating polarity, some second point in the circuit may periodically have a potential more extreme than the selected bias-point to which the substrate is connected. This causes the normally reverse-biased isolation diode between the substrate and such second point to become forward biased, thereby destroying the desired isolation and producing various undesirable effects such as injection of charge carriers from the substrate across the isolation diode PN junction, and parasitic transistor action between islands or between the substrate and the islands.

One object of the present invention is to provide improvements in reverse-biased-junction isolation integrated circuits which will prevent isolation diodes therein from becoming deleteriously forward biased when a particular bias-point to which the substrate is tied experiences a potential other than the extreme potential of opposite polarity from the substrate conductivity type.

Another object is to provide improved monolithic integrated circuits particularly suitable for operation in direct connection with an alternating polarity, i.e., alternating current voltage, power supply.

Another object is to provide an improved integrated circuit of the foregoing character which is inexpensive, does not require costly additional process steps to manufacture, and whose use with an alternating current voltage power supply does not require connection of any external auxiliary circuitry.

These and other objects of the invention will be apparent from the following description and the accompanying drawings, wherein.

Figure 1:
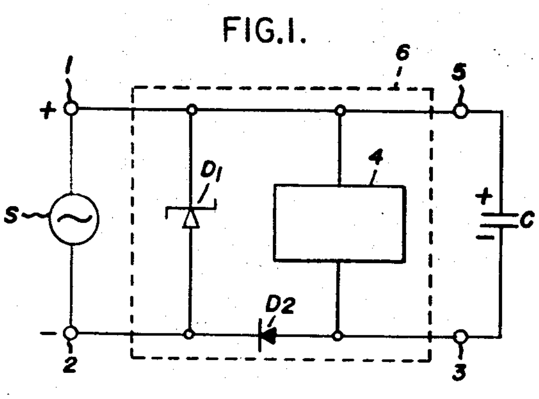
FIGS. 1 and 2 illustrate one form of semiconductor integrated circuit to which the present invention is applicable.
Figure 2:
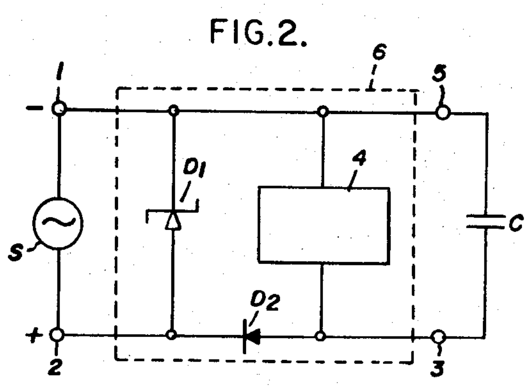

Referring to the drawing, FIGS. 1 and 2 illustrate one form of circuit to which the present invention is applicable. The circuit of FIGS. 1 and 2 includes a half-wave rectifier, connected at terminals 1 and 2 to a power supply S of alternating polarity, and including a capacitor C having one terminal 5 connected to terminal 1 and to the N-region of a diode D1 and the other terminal 3 connected to the P-region of a diode D2. The N-region of diode D2 is connected to terminal 2, as is the P-region of diode D1. Diode D1 may be a so-called avalanche type reverse voltage breakdown diode for limiting the voltage to which capacitor C is allowed to charge. Other circuitry represented by block 4, the details of which constitute no part of the present invention, may be connected in parallel with capacitor C. During the half-cycle of the alternating polarity supply S when terminal 1 is positive and terminal 2 negative, the capacitor C is charged with the polarity shown in FIG. 1 to the voltage level determined by the reverse breakdown voltage of diode D1. During the half-cycle when the polarity of supply S reverses and terminal 1 is negative as shown in FIG. 2, capacitor C is prevented from discharging back into the supply S by diode D2.

Figure 3:
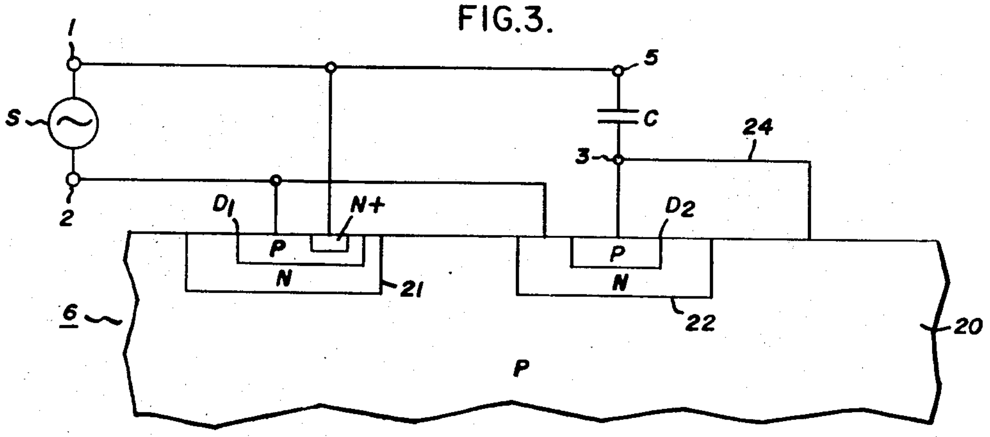
FIG. 3 is a fragmentary sectional view of a portion of the semiconductor body of the circuit of FIGS. 1 and 2, together with other circuit elements thereof.

All of the circuit elements thus far described, except the alternating supply S and capacitor C, may be constituted by a monolithic integrated circuit, the outline of the semiconductor body of which is illustrated by the dotted line 6 in FIGS. 1 and 2. A sectional view of a portion of the semiconductor body 6 of the integrated circuit of FIGS. 1 and 2 is shown in FIG. 3, omitting for simplicity and ease of understanding, all the normal junction-covering and protective insulative layers whose composition and function is well understood by those skilled in the art. The substrate portion of the semi-conductor body 6 is shown at 20, and may, for example, be of P-type conductivity. Substrate portion 20 surrounds respective islands defined by isolating PN junctions 21 and 22, and diodes D1 and D2 are formed as shown within these islands. Junctions 21 and 22, therefore, constitute isolating diodes which should be reverse biased to properly electrically isolate the islands from each other and isolate the substrate 20 from the remainder of the structure.

Figure 4:
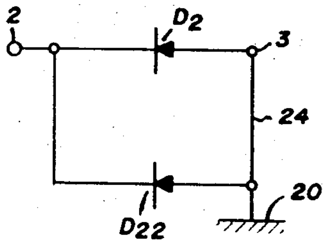
FIG. 4 is a schematic diagram of a portion of the circuit of FIG. 3.

FIG. 4 shows schematically that portion of the circuit of FIG. 3 include diode D2, the substrate 20, and the isolating diode D22 formed by the substrate-isolating junction 22. As will be evident from FIG. 4, the substrate 20 is connected to terminal 2 through the isolating diode D22, and is connected directly to terminal 3 by conductor 24.

In the operation of the circuit of FIGS. 1 through 4, when terminal 1 is positive, the capacitor C is charged as shown in FIG. 1 and the most negative point in the circuit, i.e., the point of most extreme potential of polarity opposite to that of the P-type substrate 20, is terminal 2. When terminal 2 becomes positive, diode D1 conducts in the forward direction, diode D2 prevents the capacitor C from completely discharging and the most negative point in the circuit shifts to terminal 3. Thus, if the substrate 20 is tied, as indicated by conductor 24, to terminal 3 as a normal bias-point, junctions 21 and 22 of FIG. 3 will be reverse biased for proper isolating during the half cycle when terminal 2 is positive. But during the half cycle when terminal 1 is positive and terminal 2 becomes more negative than terminal 3, junction 22 will become temporarily forward baised and substrate 20 will become connected by a low impedance path to terminal 2, and those portions of the circuit likewise connected to terminal 2, through the forward-biased junction 22. Obviously this would completely disrupt the desired isolation and produce a variety of deleterious effects on circuit performance.

To prevent junction 22 from becoming forward biased when terminal 2 becomes more negative than terminal 3, the present invention provides for clamping the substrate 20 to whatever portion of the circuit has the most extreme potential of the opposite polarity from the conductivity type of the substrate, i.e., the most negative-going portion of the P-type substrate circuit of FIG. 3. So that when the potential of terminal 2 becomes more extreme, i.e., more negative than that of terminal 3, the potential of substrate 20 is according to the present invention correspondingly made more negative.

Figure 5:
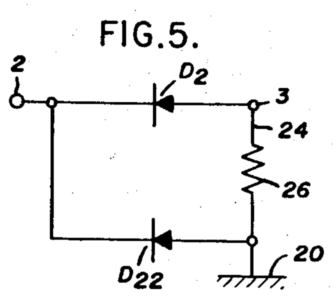
FIG. 5 is a circuit similar to that of FIG. 4, modified according to one form of the invention.

FIG. 5 is similar to FIG. 4 but shows how forward biasing of substrate diode D22 is effectively minimized according to one form of the present invention. Basically, the present invention provides means for reducing the current flow through the substrate diode D22, when the substrate diode tends to become forward biased, to a level such that carrier injection at the substrate diode is insufficient to cause harmful parasitic effects in the circuit. This is accomplished by preventing forward voltage across the substrate diode D22 from exceeding that value, e.g., approximately 0.3 volt in the case of a substrate of germanium semiconductor material and 0.6 volt in the case of silicon, where the well-known "knee" occurs in the graph of forward current vs. forward voltage for such diodes. Such "knee" is shown for example in FIG. 1.17 of the General Electric Transistor Manual, 7th edition, copyright 1964.

In the circuit of FIG. 5, forward biasing of diode D22 is effectively minimized by placing a resistor 26 in the path 24 between substrate 20 and terminal 3. The resistor 26 is thus in series with diode D22, with relation to the path between terminal 3 and terminal 2, and is of a value sufficiently large to reduce the voltage across diode D22, and the current through diode D22, below a level so that carrier injection across the PN junction of diode D22 is insufficient to cause harmful parasitic effects in the circuit or degrade the isolation of other elements of the circuit from each other and from the substrate. The value of resistor 26 should be sufficiently large to limit the forward voltage drop across diode D22 in accordance with the above-defined criteria, e.g., to less than about 0.6 volt in the case of silicon, but should not be so large as to allow the substrate to in effect be disconnected from terminal 3, during the half cycle of the AC supply when terminal 3 is the most extreme potential point in the circuit. Thus the optimum value of resistor 26 will depend somewhat on current levels in the particular circuit to which the invention is applied, but it has been found that a resistance value of about 100–5,000 ohms is normally sufficient for resistor 26 when silicon is the integrated circuit semiconductor material.

In the circuit of FIG. 5, the diode D2 should, for optimum effect in limiting forward voltage drop across diode D22, have as low as possible a forward voltage drop of its own. Accordingly, diode D2 may preferably be of a type having an inherently low forward voltage drop, such as a Schottky diode.

Figure 6:
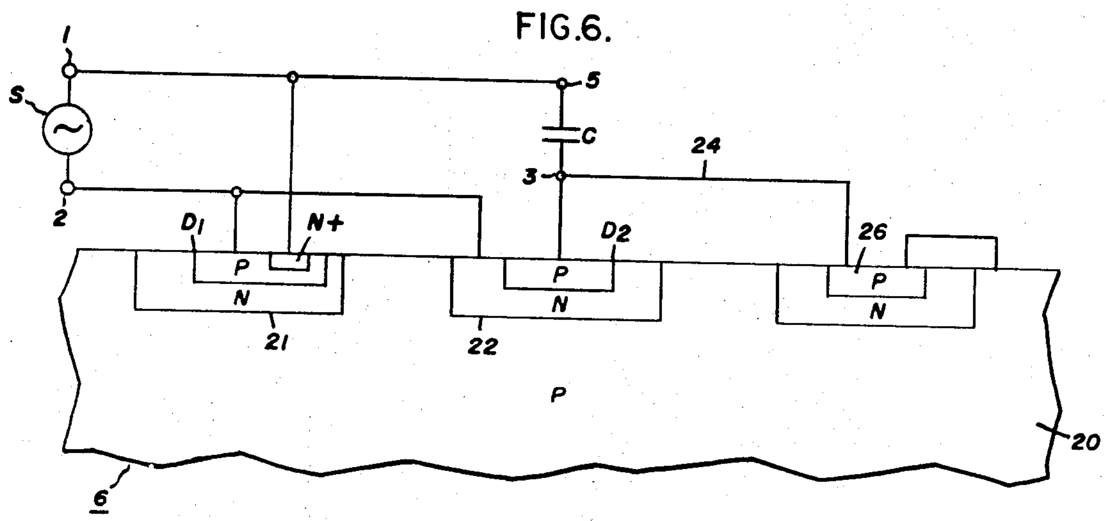
FIG. 6 is similar to FIG. 3 and includes the modification of FIG. 5.

FIG. 6 shows the semiconductor body 6 of FIG. 3 modified to include resistor 26 in the connective path between terminal 3 and substrate 20. The resistor 26 may, as is well understood by those skilled in the art, be provided in the physical or structural form of an impurity impregnated region within body 6 produced by conventional diffusion processes simultaneously with the formation of diodes D1 and D2, thereby essentially precluding any extra costs or process steps in the provision of resistor 26. As is shown in FIG. 6, resistor 26 is thereby formed within an island 26A which separates resistor 26 from substrate 20.

Figure 7:
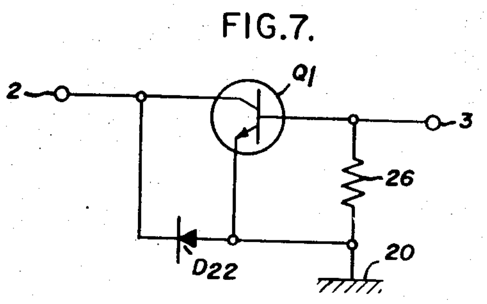
FIG. 7 is similar to FIG. 5, modified according to another form of the invention.
Figure 8:
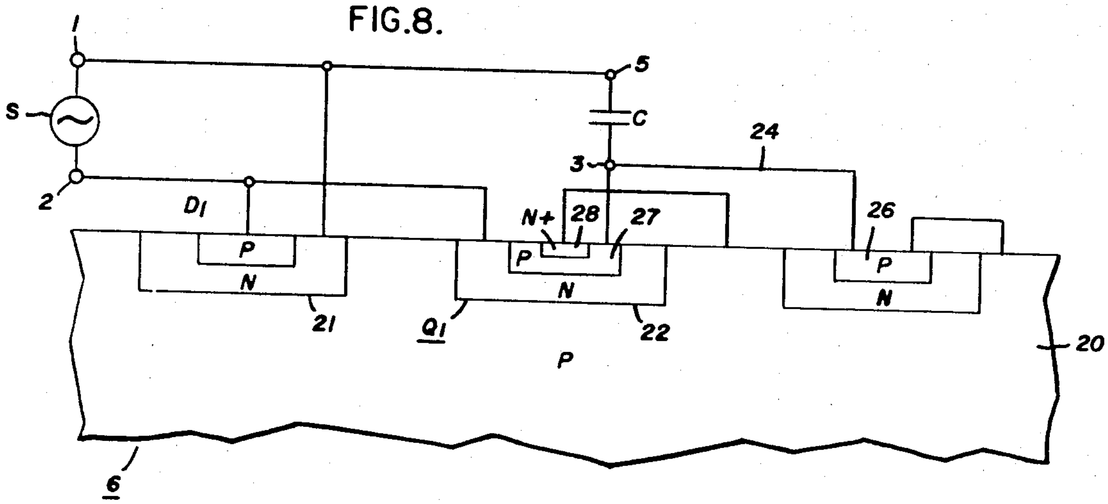
FIG. 8 is similar to FIG. 6, and includes the modification of FIG. 7.

Another form of the invention is shown in FIGS. 7 and 8. FIG. 7 is similar to FIG. 6 except that diode D2 is replaced by an NPN transistor Q1, the base of which is tied to terminal 3, the collector to terminal 2, and the emitter to substrate 20. In the operation of the circuit of FIGS. 7 and 8, when the potential at terminal 2 becomes more negative than that at terminal 3, transistor Q1 conducts and shunts isolation diode D22, clamping substrate 20 to terminal 2 and preventing D22 from becoming forward biased.

The transistor circuit embodiment of FIG. 7 is preferred to the diode circuit embodiment of FIG. 5 because the collector-emitter voltage drop of a conducting transistor is usually less than the forward voltage drop of a diode, so the transistor Q1 provides a more effective shunt for diode D22 to insure that D22 will not become forward biased during circuit operation.

Although the transistor Q1 can be arranged with either emitter or collector connected to substrate 20, the inverse mode of connection, i.e., with collector of Q1 connected to terminal 2 and emitter of Q1 connected to substrate 20, is preferred to the normal mode because the higher reverse voltage capability of the collector-base junction of the transistor is then available in the circuit between terminals 2 and 3 when the transistor is not turned on.

FIG. 8 is similar to FIGS. 3 and 6 and shows the semiconductor body of FIG. 3 modified to include transistor Q1 in place of diode D2. The base region 27 of transistor Q1 may, of course, be formed by conventional diffusion process steps simultaneously with the formation of diode D1 and resistor 26, or simultaneously with formation of other circuit elements, and the emitter region 28 may be likewise formed simultaneously with other circuit elements so that essentially no additional process steps or processing costs are required to include transistor Q1 in the circuit.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What I claim as new and desire to secure by Letters Patent of the United States is:

1. In a monolithic semiconductor integrated circuit adapted to be energized by a power supply of alternating polarity and including a body of semiconductor material having a region forming a circuit element isolated from a substrate portion of the body by a PN junction diode formed between said circuit element and said substrate portion, a first bias point in said circuit having, when said power supply has one polarity, a potential more extreme than that of said region and of polarity opposite to the conductivity type of said substrate portion, means for reverse-biasing said PN junction when said power supply has said one polarity comprising first connector means extending between said substrate portion and said first bias point, a second bias point in said circuit having, when said power supply has a polarity opposite to said one polarity, a potential more extreme than that of said region and of polarity opposite to the conductivity type of said substrate portion, and means for preventing said PN junction diode from becoming forward biased sufficiently to permit deleterious flow of charge carriers thereacross when said power supply alternates to said opposite polarity comprising second connector means in circuit with said substrate and said second bias point for clamping said substrate at a potential differing from the potential of said second bias point by an amount less than the voltage at the knee of the forward conduction voltage-current curve of said PN junction diode.

2. The circuit defined in claim 1 wherein said second connector means includes a transistor having its base tied to said first bias point, one of the other electrodes of the transistor being tied to the substrate portion of the body, and the other of the electrodes of the transistor being tied to the second bias point.

3. The circuit defined in claim 1 wherein said second connector means includes a transistor having its base tied to said first bias point, the normal collector of the transistor being connected in inverse mode as an emitter to said second bias point, and the normal emitter of said transistor being connected in inverse mode as a collector to said substrate portion of the body.

4. The circuit defined in claim 1 wherein said second connector means includes a resistor connected between said substrate and said first bias point.

5. In a monolithic semiconductor integrated circuit adapted to be energized by a power supply of alternating polarity and including a body of semiconductor material having a region forming a circuit element isolated from a substrate portion of the body by a PN junction diode formed between said circuit element and said substrate portion, a first bias point in said circuit having, when said power supply has one polarity, a potential more extreme than that of said region and of polarity opposite to the conductivity type of said substrate portion, means for reverse-biasing said PN junction when said power supply has said one polarity comprising first connector means extending between said substrate portion and said first bias point, a second bias point in said circuit having, when said power supply has a polarity opposite to said one polarity, a potential more extreme than that of said region and of polarity opposite to the conductivity type of said substrate portion, and switching circuit means providing a low impedance connection between said substrate and said second bias point whenever said power supply has said opposite polarity to prevent said PN junction diode from becoming deleteriously forward biased.

References Cited

UNITED STATES PATENTS

| | | | |
|---|---|---|---|
| 3,230,429 | 1/1966 | Stehney | 307—303 X |
| 3,421,025 | 1/1969 | Mitchell et al. | 307—303 X |

DONALD D. FORRER, Primary Examiner

R. C. WOODBRIDGE, Assistant Examiner

U.S. Cl. X.R.

307—237; 317—235